(12) United States Patent
Ardisana et al.

(10) Patent No.: US 12,720,709 B2
(45) Date of Patent: Aug. 25, 2026

(54) EYEWEAR DEVICE WITH THERMAL VAPOR CHAMBER

(71) Applicants: John Bernard Ardisana, Torrance, CA (US); Scott Myers, Orange, CA (US); David Fliszar, Manhattan Beach, CA (US); Nicholas Streets, Los Angeles, CA (US); Andrea Ashwood, Culver City, CA (US)

(72) Inventors: John Bernard Ardisana, Torrance, CA (US); Scott Myers, Orange, CA (US); David Fliszar, Manhattan Beach, CA (US); Nicholas Streets, Los Angeles, CA (US); Andrea Ashwood, Culver City, CA (US)

(73) Assignee: Snap Inc., Santa Monica, CA (US)

( * ) Notice: Subject to any disclaimer, the term of this patent is extended or adjusted under 35 U.S.C. 154(b) by 629 days.

(21) Appl. No.: 17/512,359

(22) Filed: Oct. 27, 2021

(65) Prior Publication Data

US 2023/0131070 A1 Apr. 27, 2023

(51) Int. Cl.
*H05K 7/20* (2006.01)
*G02C 5/14* (2006.01)
*G02C 11/00* (2006.01)

(52) U.S. Cl.
CPC ........... *H05K 7/20336* (2013.01); *G02C 5/14* (2013.01); *G02C 11/10* (2013.01)

(58) Field of Classification Search
CPC .............. F28F 2255/02; F28F 2280/10; H01L 23/4332; F28D 15/0208; H05K 7/20336; G02C 5/14; G02C 11/10
See application file for complete search history.

(56) References Cited

U.S. PATENT DOCUMENTS

2016/0212889 A1* 7/2016 Nikkhoo ............ H05K 7/20963
2016/0363787 A1* 12/2016 Blum ....................... G02C 5/14
(Continued)

FOREIGN PATENT DOCUMENTS

CN 111726972 A 9/2020
EP 3396438 A1 10/2018
(Continued)

OTHER PUBLICATIONS

Search Report and Written Opinion received in International Application No. PCT/US2022/047016 dated Feb. 10, 2023, 9 pages.
(Continued)

*Primary Examiner* — Khaled Ahmed Ali Al Samiri
(74) *Attorney, Agent, or Firm* — CM Law; Stephen J. Weed

(57) ABSTRACT

An electronic eyewear device having a thermal management device including a vapor chamber in the temples. The temples may have a sheet metal portion thermally connected to heat generating electronics, wherein the vapor chamber is thermally coupled to the sheet metal along a length thereof to disperse heat generated by the electronics. The sheet metal and the vapor chamber may be encompassed by a non-thermally conducting material, such as being over molded by a silicone material, to prevent user contact with the heated sheet metal and vapor chamber. The sheet metal and the vapor chamber are generally planar and lightweight, and they are bent to bias the temples against a user's head when worn to provide preloading.

14 Claims, 5 Drawing Sheets

(56) References Cited

U.S. PATENT DOCUMENTS

| | | | |
|---|---|---|---|
| 2018/0376626 A1 | 12/2018 | Hurbi et al. | |
| 2019/0107870 A1 | 4/2019 | Ali | |
| 2020/0068746 A1* | 2/2020 | Juma | H05K 7/20309 |
| 2021/0098837 A1 | 4/2021 | Ashwood et al. | |
| 2022/0171219 A1* | 6/2022 | Li | H05K 7/2039 |
| 2022/0346277 A1* | 10/2022 | Yoon | H05K 7/20336 |

FOREIGN PATENT DOCUMENTS

| | | | |
|---|---|---|---|
| JP | 2016048340 | A | 4/2016 |
| JP | 2017134100 | A | 8/2017 |
| KR | 200433643 | Y1 | 12/2006 |
| WO | 2019032198 | A1 | 2/2019 |
| WO | 2021017401 | A1 | 2/2021 |

OTHER PUBLICATIONS

Supplementary European Search Report for European Application No. 22887949.0 dated Sep. 12, 2025 (Sep. 12, 2025)—8 pages.

* cited by examiner

500

502 Couple vapor chamber to sheet metal

504 Couple battery to temple

506 Encompass temple in non-thermally conductive material

EYEWEAR DEVICE WITH THERMAL VAPOR CHAMBER

TECHNICAL FIELD

Examples set forth in the present disclosure relate to portable electronic devices, including wearable electronic devices such as eyeglasses. More particularly, but not by way of limitation, the present disclosure describes an electronic eyewear device comprising a thermal management device.

BACKGROUND

Many electronic devices available today include wearable consumer electronic devices. Wearable consumer electronic devices may generate excess heat.

BRIEF DESCRIPTION OF THE DRAWINGS

Features of the various implementations disclosed will be readily understood from the following detailed description, in which reference is made to the appending drawing figures. A reference numeral is used with each element in the description and throughout the several views of the drawing. When a plurality of similar elements is present, a single reference numeral may be assigned to like elements, with an added lower-case letter referring to a specific element.

The various elements shown in the figures are not drawn to scale unless otherwise indicated. The dimensions of the various elements may be enlarged or reduced in the interest of clarity. The several figures depict one or more implementations and are presented by way of example only and should not be construed as limiting. Included in the drawing are the following figures.

DETAILED DESCRIPTION

Figure 1:
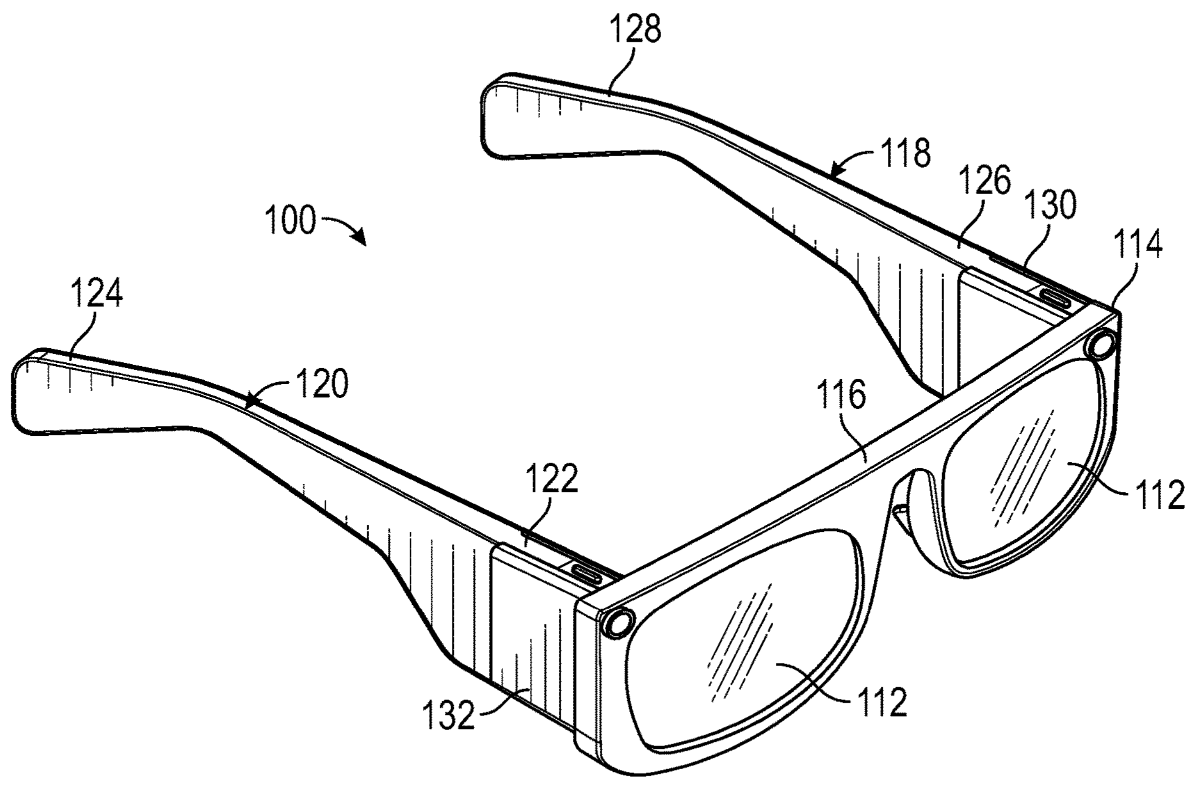
FIG. 1 is a front perspective view of an example electronic eyewear device.

An electronic eyewear device having a thermal management device including a vapor chamber in the temples. The temples may have a sheet metal portion thermally connected to heat generating electronics, wherein the vapor chamber is thermally coupled to the sheet metal along a length thereof to disperse heat generated by the electronics. The sheet metal and the vapor chamber may be encompassed by a non-thermally conducting material, such as being over molded by a silicone material, to prevent user contact with the heated sheet metal and vapor chamber. The sheet metal and the vapor chamber are generally planar and lightweight, and they are bent to bias the temples against a user's head when worn to provide preloading.

The following detailed description includes systems, methods, techniques, instruction sequences, and computing machine program products illustrative of examples set forth in the disclosure. Numerous details and examples are included for the purpose of providing a thorough understanding of the disclosed subject matter and its relevant teachings. Those skilled in the relevant art, however, may understand how to apply the relevant teachings without such details. Aspects of the disclosed subject matter are not limited to the specific devices, systems, and method described because the relevant teachings can be applied or practice in a variety of ways. The terminology and nomenclature used herein is for the purpose of describing particular aspects only and is not intended to be limiting. In general, well-known instruction instances, protocols, structures, and techniques are not necessarily shown in detail.

The term "connect", "connected", "couple" and "coupled" as used herein refers to any logical, optical, physical, or electrical connection, including a link or the like by which the electrical or magnetic signals produced or supplied by one system element are imparted to another coupled or connected system element. Unless described otherwise, coupled or connected elements or devices are not necessarily directly connected to one another and may be separated by intermediate components, elements, or communication media, one or more of which may modify, manipulate, or carry the electrical signals. The term "on" means directly supported by an element or indirectly supported by the element through another element integrated into or supported by the element.

Additional objects, advantages and novel features of the examples will be set forth in part in the following description, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

Reference now is made in detail to the examples illustrated in the accompanying drawings and discussed below.

Wearable devices available today generate excessive heat that may impair device function. A wearable device that includes a thermal management device is disclosed. The wearable device includes a body that holds one or more optical elements. It also includes onboard electronic components and a heat source that radiates heat during operation of the components. The device also includes a heat sink at another area of the eyewear body and a thermal coupling disposed within the eyewear body thermally coupled to the heat source and the heat sink to increase heat dissipation of the electronic components.

Figure 2:
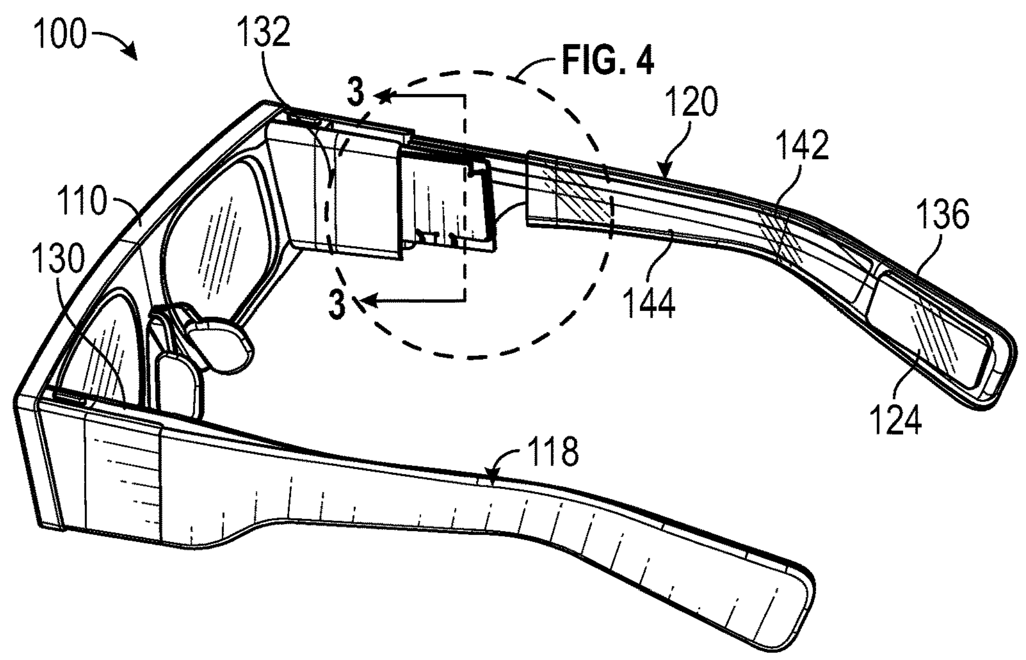
FIG. 2 is a rear perspective view of the electronic eyewear device of FIG. 1.

FIG. 1 is a front perspective view of an electronic eyewear device 100 and FIG. 2 is a rear perspective view of the electronic eyewear device 100 configured to be worn on the head of a user. The electronic eyewear device 100 comprises an eyewear body 110 that holds and supports one or more optical elements 112 within a field of view of the user. In this non-limiting example, eyewear body 110 includes a frame 114 having a bridge 116 that is constructed and arranged to sit on a nose of the user. A proximal section 126 of the left temple 118 is thermally coupled to a left side of bridge 116 and extends rearwardly a sufficient length to a distal section 128 configured to extend over a left ear of the user. A proximal section 122 of the right temple 120 is thermally coupled to a right side of bridge 116 and extends rearwardly a sufficient length to a distal section 124 configured to extend over a right ear of the user. Also shown in these views are compartments 130 and 132 for at least partially housing onboard electronic components 134 including a processor (shown in FIG. 3 and FIG. 4) that control operation of the eyewear device 100. The onboard electronic components 134 may produce excess heat that interferes with normal operation of the electronic eyewear device 100. A battery 136 is provided at the distal end 124 of the right temple 120 to power the onboard electronic components 134, and at the distal end 128 of the left temple 118.

Figure 3:
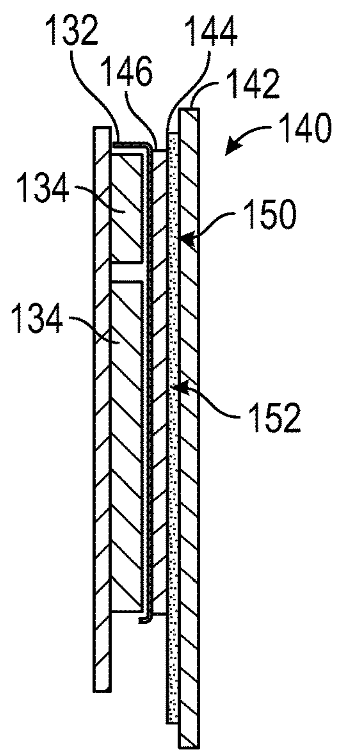
FIG. 3 illustrates a sectional view of the right temple taken along line 3-3 in FIG. 2.
Figures 4, 5:
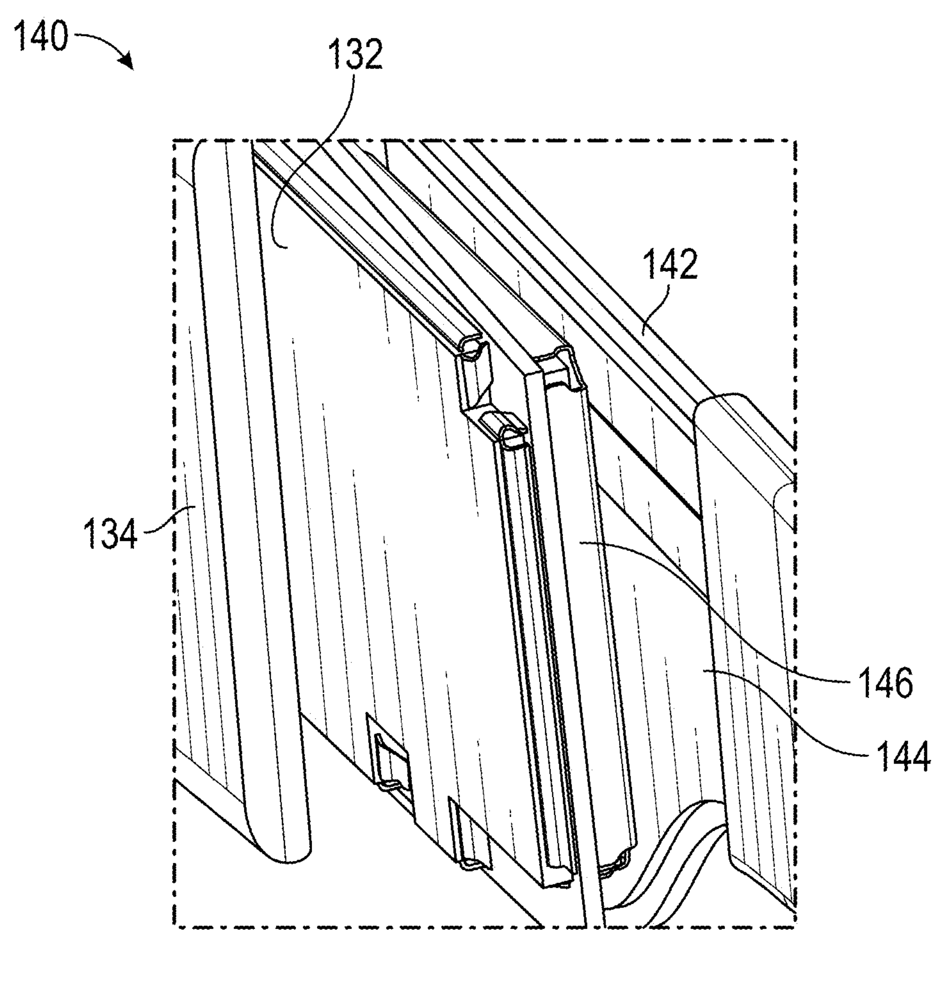
FIG. 4 is an enlarged sectional view of the thermal management system of FIG. 2
FIG. 5 illustrates a method of making the temples.

FIG. 3 shows a side cross sectional view taken along lines 3-3 of the right temple 120 shown in FIG. 2 and illustrates an example thermal management device 140 for managing and dissipating the excess heat generated by onboard electronic components 134 to maintain normal operation of electronic eyewear device 100. FIG. 4 illustrates an enlarged sectional view of the thermal management device 140 of the right temple 120, wherein the left temple 118 mirrors the right temple 120 and also includes a thermal management device 140. The onboard electronic components 134, which are substantially housed within compartments 130 and 132, comprise a heat source producing heat. Each thermal management device 140 includes a thin and generally planar sheet metal 142 and a thin and generally planar vapor chamber 144 that are coupled together along their length, such as by welding to create a weld. A graphite layer is coupled to the outside of vapor chamber 144 opposite the side of the weld to sheet metal 142 to operate as a heat spreader evening out the generated heat. The sheet metal 142 and the vapor chamber 144 extend the length of the right temple 120 to the distal end, and dissipate heat produced by the onboard electronic components 134. The distal end of the vapor chamber 144 forms a condenser side of the vapor chamber 144 and is coupled to a heat sink at the distal end of the temple, such as the battery 136. Thermal paste 146 is disposed between an outer surface of vapor chamber 144 and an inner surface of the opposing compartment 132. The paste 146 is configured to evenly and thermally couple heat from the onboard electronic components 134 and compartment 132 to both the vapor chamber 144 and the sheet metal 142. The sheet metal 142 forms a structural backbone for the vapor chamber 144, and it may be comprised of titanium. Each sheet metal 142 is bent to bias the temples 118 and 120 against a head of the user when worn to provide a preload. The preload distributes some of the eyewear mass throughout the head to make it feel more wearable (vs having point contacts on the nose and ear).

The sheet metal 142 and the vapor chamber 144 are encompassed by a non-thermally conductive material 148, such as by over molding them in silicone, which forms a part of the thermal management device 140 and helps reduce transmission of heat from the vapor chamber to a user of the eyewear. FIG. 2 illustrates some of the material 148 removed in the midsection of right temple 120 to illustrate the vapor chamber 144. The vapor chamber 144 is very thin, and hollow, having an elongated thin cavity 150 encompassed in the vapor chamber 144 and extending the length of the right temple 120. In one example, the cavity 150 may have a thickness of 0.02 millimeters, wherein the vapor chamber 144 has a thickness of 0.08 millimeters. A liquid 152 is disposed in the cavity 150 and heats up when the vapor chamber 144 heats up. The liquid 152 will change phase to vapor when heated. During this phase change from liquid to vapor, the temperature of the vapor chamber 144 is held constant rather than continuing to heat up. This allows the vapor chamber to pull more heat from the onboard electronic components 134 that compared to a standard heat sink.

In another example, the thickness of the walls of the vapor chamber 144 can have increased thickness to eliminate the need for the sheet metal 142.

Figure 6:
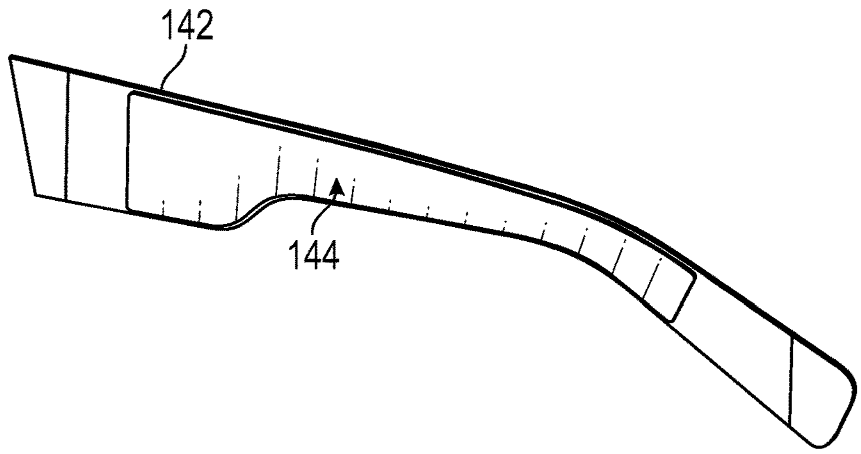
FIGS. 6-8 illustrate the method of FIG. 5.
Figure 7:
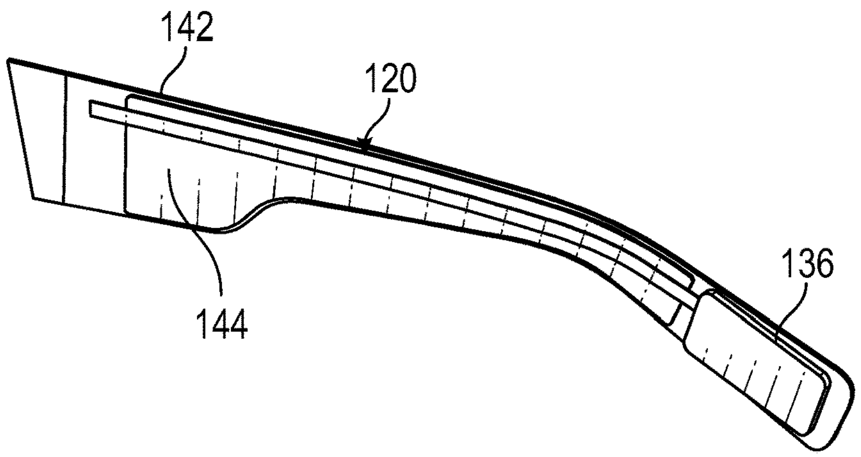
Figure 8:
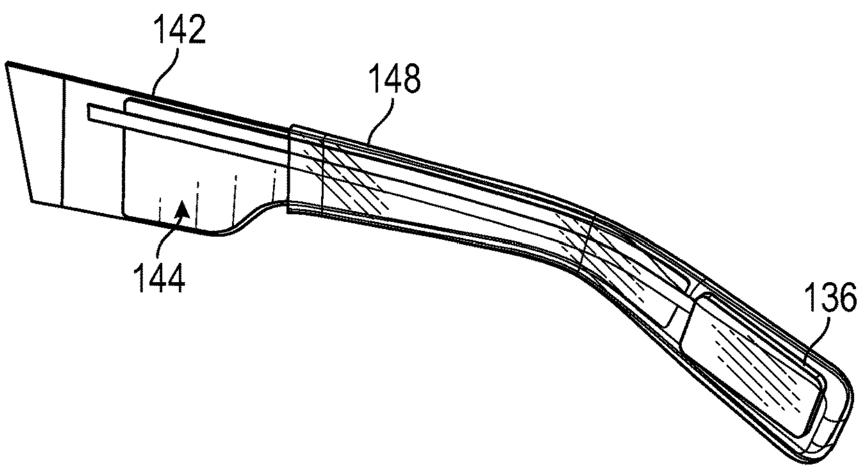

FIG. 5 illustrates an example method 500 of making the temples 118 and 120 in view of FIGS. 6-8.

Referring to FIG. 5, at block 502 the vapor chamber 144 is coupled to the sheet metal 142, such as by welding, as shown in FIG. 6. In other examples, the two members can be secured by a thermal glue or the like. The sheet metal 142 may be comprised of titanium, and it forms a structural backbone for the temple. In another example, the vapor chamber is sufficiently rigid and the support member may be eliminated.

At block 502, the battery 136 is coupled to the temple as shown in FIG. 7. The battery 136 is electrically coupled to, and configured to power, the onboard electronic components 134.

At block 504, the assembled sheet metal 142 and vapor chamber 144 are encompassed by the non-thermally conductive material 148, as shown in FIG. 8, such as by over molding silicone over the members. The silicone protects a user against the temperatures of the sheet metal 142 and vapor chamber 144.

Figure 9:
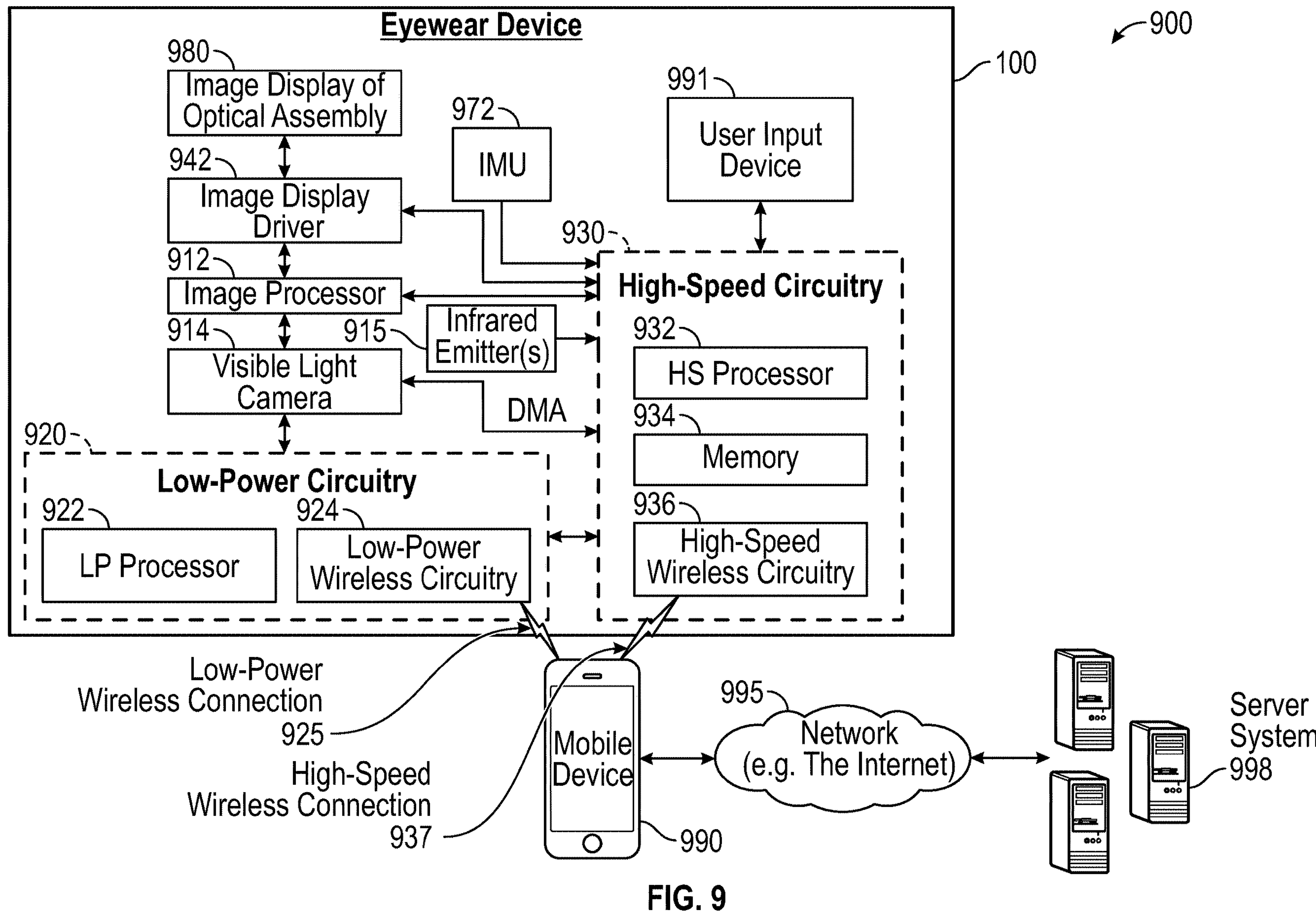
FIG. 9 is a diagrammatic representation of an example eyewear device in communication with a mobile device and a server system connected via various networks.

FIG. 9 is a block diagram that depicts example circuitry provided by components of the electronic eyewear device 100, which may be located on one or more circuit boards located in the eyewear body 110, including compartments 130 and 132. As shown, circuitry 930 includes a high-speed processor 932, a memory 934, and high-speed wireless circuitry 936. In the example, the image display driver 942 is coupled to the high-speed circuitry 930 and operated by the high-speed processor 932 in order to drive the left and right image displays of electronic eyewear device having optical assemblies. High-speed processor 932 may be any processor capable of managing high-speed communications and operation of any general computing system needed for electronic eyewear device 100. High-speed processor 932 includes processing resources needed for managing high-speed data transfers on high-speed wireless connection 937 to a wireless local area network (WLAN) using high-speed wireless circuitry 936. In certain examples, the high-speed processor 932 executes an operating system such as a LINUX operating system or other such operating system of the electronic eyewear device 100 and the operating system is stored in memory 934 for execution. In addition to any other responsibilities, the high-speed processor 932 executes a software architecture for the electronic eyewear device 100 that is used to manage data transfers with high-speed wireless circuitry 936. In certain examples, high-speed wireless circuitry 936 is configured to implement Institute of Electrical and Electronic Engineers (IEEE) 802.11 communication standards, also referred to herein as Wi-Fi. In other examples, other high-speed communications standards may be implemented by high-speed wireless circuitry 936.

The low-power circuitry 920 includes a low-power processor 922 and low-power wireless circuitry 924. The low-power wireless circuitry 924 and the high-speed wireless circuitry 936 of the electronic eyewear device 100 can include short range transceivers (Bluetooth™) and wireless wide, local, or wide-area network transceivers (e.g., cellular or WiFi). Mobile device 990, including the transceivers communicating via the low-power wireless connection 925 and the high-speed wireless connection 937, may be implemented using details of the architecture of the electronic eyewear device 100, as can other elements of the network 995.

Memory 934 includes any storage device capable of storing various data and applications, including, among other things, camera data generated by camera(s), the image processor 912, and images generated for display by image display driver 942 on the image display of optical assemblies. Although the memory 934 is shown as integrated with high-speed circuitry 930, the memory 934 in other examples may be an independent, standalone element of the electronic eyewear device 100. In certain such examples, electrical routing lines may provide a connection through a chip that includes the high-speed processor 932 from the image processor 912 or low-power processor 922 to the memory 934. In other examples, the high-speed processor 932 may manage addressing of memory 934 such that the low-power processor 922 will boot the high-speed processor 932 any time that a read or write operation involving memory 934 is needed.

As shown, the high-speed processor 932 of the electronic eyewear device 100 can be coupled to the camera system, the image display driver 942, the user input device 991, and the memory 934.

The output components of the electronic eyewear device 100 include visual elements, such as the left and right image displays associated with each lens or optical assembly (not shown), a plasma display panel (PDP), a light emitting diode (LED) display, a projector, or a waveguide. The eyewear device 100 may include a user-facing indicator (e.g., an LED or a vibrating actuator), and/or an outward-facing signal (e.g., an LED). The image displays 980 of each optical assembly are driven by the image display driver 942. In some example configurations, the output components of the electronic eyewear device 100 further include additional indicators such as tactile components (e.g., an actuator such as a vibratory motor to generate haptic feedback), and other signal generators. The user-facing set of indicators are configured to be seen or otherwise sensed by the user of the device 100. For example, the device 100 may include an LED display positioned so the user can see it, a loudspeaker positioned to generate a sound the user can hear, or an actuator to provide haptic feedback the user can feel. The outward-facing set of signals are configured to be seen or otherwise sensed by an observer near the device 100. Similarly, the device 100 may include an LED, a loudspeaker, or an actuator that is configured and positioned to be sensed by an observer.

The input components of the eyewear device 100 may include alphanumeric input components (e.g., a touch screen or touchpad configured to receive alphanumeric input, a photo-optical keyboard, or other alphanumeric-configured elements), pointer-based input components (e.g., a mouse, a touchpad, a trackball, a joystick, a motion sensor, or other pointing instruments), tactile input components (e.g., a button switch, a touch screen or touchpad that senses the location and/or force of touches or touch gestures, or other tactile-configured elements), and audio input components (e.g., a microphone), and the like. The mobile device 990 and the server system 998 may include alphanumeric, pointer-based, tactile, audio, and other input components.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. An electronic eyewear device, comprising:

a frame configured to be worn on a head of a user;

an optical component supported by the frame;

an electronic component carried by the frame and configured to generate heat during powered operation;

a planar temple comprising sheet metal, the temple having a proximal end coupled to the frame and extending to a distal end that is configured to be disposed on the user's ear;

a battery disposed at the distal end of the temple and forming a heatsink;

a planar vapor chamber coupled to and adjacent an outer surface of the sheet metal along a length of the sheet metal, wherein each end of the vapor chamber is longitudinally spaced from a respective end of the sheet metal, the vapor chamber including a fluid configured to change states as a temperature of the temple changes; and a weld extending along the length of the sheet metal and the vapor chamber to the distal end of the temple, wherein the vapor chamber is secured to the sheet metal by the weld.

2. The electronic eyewear device of claim 1, wherein the vapor chamber and the weld are over molded with a material.

3. The electronic eyewear device of claim 2, wherein the material comprises silicone.

4. The electronic eyewear device of claim 1, wherein the vapor chamber is bent at the distal end of the temple.

5. The electronic eyewear device of claim 4, wherein the temple is also bent at the distal end of the temple.

6. The electronic eyewear device of claim 1, further comprising a thermal paste disposed between the vapor chamber and the electronic component.

7. An electronic eyewear device, comprising:

a frame configured to be worn on a head of a user;

an optical component supported by the frame;

an electronic component carried by the frame and configured to generate heat during powered operation;

a planar temple comprising sheet metal, the temple extending rearwardly from the frame to a distal end that is configured to be disposed on the user's ear, a battery disposed at the distal end of the temple and forming a heatsink, wherein the temple comprises a planar vapor chamber coupled to and adjacent an outer surface of the sheet metal extending along a length of the sheet metal, wherein each end of the vapor chamber is longitudinally spaced from a respective end of the sheet metal, the vapor chamber including a fluid configured to change states as a temperature of the temple changes; and a weld extending along the length of the sheet metal and the vapor chamber to the distal end of the temple, wherein the vapor chamber is secured to the sheet metal by the weld.

8. The electronic eyewear device of claim 7, wherein the vapor chamber is bent.

9. The electronic eyewear device of claim 7, further comprising a thermal paste disposed between the vapor chamber and the temple.

10. The electronic eyewear device of claim 7, wherein the vapor chamber and the weld are over molded with a material.

11. The electronic eyewear device of claim 10, wherein the material comprises silicone.

12. A method of making an eyewear device comprising a frame configured to be worn on a head of a user, an optical component supported by the frame, an electronic component carried by the frame and configured to generate heat during powered operation, a planar temple comprising sheet metal, the temple having a proximal end and extending to a distal end that is configured to be disposed on the user's ear, a battery disposed at the distal end of the temple and forming a heatsink, and a vapor chamber coupled to and adjacent an outer surface of the sheet metal extending along a length of the sheet metal, wherein each end of the vapor chamber is longitudinally spaced from a respective end of the sheet metal, the vapor chamber including a fluid configured to change states as a temperature of the temple changes, and a weld extending along a length of the temple and the vapor chamber to the distal end of the temple, wherein the vapor chamber is secured to the sheet metal by the weld, comprising;

thermally coupling the temple to the frame; and coupling the vapor chamber to the sheet metal along the length of the sheet metal.

13. The method as specified in claim 12, wherein the vapor chamber is bent.

14. The method as specified in claim 12, further comprising disposing a material about the temple and the vapor chamber.

* * * * *